US008648617B2

(12) United States Patent
Maruyama et al.

(10) Patent No.: US 8,648,617 B2
(45) Date of Patent: Feb. 11, 2014

(54) SEMICONDUCTOR DEVICE AND METHOD OF TESTING SEMICONDUCTOR DEVICE

(75) Inventors: Yuji Maruyama, Yokohama (JP);
Tatsuhiro Mizumasa, Yokohama (JP);
Takayuki Nakashiro, Yokohama (JP);
Shigeru Gotoh, Yokohama (JP);
Takayuki Yano, Yokohama (JP);
Susumu Koshinuma, Yokohama (JP);
Shunsuke Taniguchi, Yokohama (JP);
Yuki Yanagisako, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 330 days.

(21) Appl. No.: 13/022,174

(22) Filed: Feb. 7, 2011

(65) Prior Publication Data

US 2011/0221466 A1  Sep. 15, 2011

(30) Foreign Application Priority Data

Mar. 15, 2010  (JP) .................................. 2010-057470

(51) Int. Cl.
*G01R 31/26* (2006.01)

(52) U.S. Cl.
USPC ............. 324/762.01; 324/756.05; 324/762.02

(58) Field of Classification Search
USPC ................. 324/762.01–763.02, 750.3–754.2, 324/755.01–756.07
See application file for complete search history.

(56) References Cited

U.S. PATENT DOCUMENTS

| 5,903,012 | A  | * | 5/1999  | Boerstler ........................ 257/48 |
| 6,228,684 | B1 |   | 5/2001  | Maruyama |
| 6,297,659 | B1 | * | 10/2001 | Saito ........................ 324/762.01 |
| 6,342,790 | B1 | * | 1/2002  | Ferguson et al. ........ 324/762.02 |
| 6,806,726 | B2 | * | 10/2004 | Okada et al. .............. 324/762.09 |
| 7,212,046 | B2 | * | 5/2007  | Hur ................................ 327/143 |
| 7,868,640 | B2 | * | 1/2011  | Agarwal et al. .......... 324/762.02 |
| 8,217,671 | B2 | * | 7/2012  | Agarwal et al. .......... 324/750.03 |
| 2001/0042901 | A1 |   | 11/2001 | Maruyama |
| 2004/0206954 | A1 |   | 10/2004 | Maruyama |
| 2006/0202201 | A1 |   | 9/2006  | Maruyama |
| 2008/0251788 | A1 |   | 10/2008 | Maruyama |
| 2008/0284471 | A1 | * | 11/2008 | Kobayashi ..................... 327/109 |
| 2010/0201394 | A1 | * | 8/2010  | Kobatake ...................... 324/763 |

FOREIGN PATENT DOCUMENTS

| JP | 05-288798 A   | 11/1993 |
| JP | 2000-196021 A | 7/2000  |
| JP | 2007-258728 A | 10/2007 |
| JP | 2009-193432 A | 8/2009  |

OTHER PUBLICATIONS

JP Office Action, Japanese Application No. 2010-057470 dated Aug. 23, 2013.

* cited by examiner

*Primary Examiner* — Huy Q Phan
*Assistant Examiner* — Dustin Dickinson
(74) *Attorney, Agent, or Firm* — Arent Fox LLP

(57) ABSTRACT

According to the following disclosure, disclosed is a semiconductor device including: an internal circuit configured to receive and output a signal current; a current mirror unit outputting a copied current corresponding to the signal current; and a test pad from which the copied current is taken out.

13 Claims, 15 Drawing Sheets

FIG. 14

| switch | first internal circuit 51 | | second internal circuit 52 | | third internal circuit 53 | |
|---|---|---|---|---|---|---|
| | when copying the output signal current I3 | when copying the input signal current I6 | when copying the output signal current I3 | when copying the input signal current I6 | when copying the output signal current I3 | when copying the input signal current I6 |
| SW2 | on | off | on | off | on | off |
| SW3 | on | off | on | off | on | off |
| SW5 | off | on | off | on | off | on |
| SW6 | off | on | off | on | off | on |
| SW7 | on | off | on | off | on | off |
| SW8 | off | off | off | off | off | off |
| SW9 | off | on | off | off | off | off |
| SW10 | off | off | off | off | off | off |
| SW11 | off | off | off | on | off | off |
| SW12 | off | off | off | off | off | on |

SEMICONDUCTOR DEVICE AND METHOD OF TESTING SEMICONDUCTOR DEVICE

CROSS-REFERENCE TO RELATED APPLICATIONS

This application is based upon and claims the benefit of priority of the prior Japanese Patent Application No. 2010-057470, filed on Mar. 15, 2010, the entire contents of which are incorporated herein by reference.

FIELD

It is related to a semiconductor device and a method of testing a semiconductor device.

BACKGROUND

Various semiconductor devices including an LSI and the like are installed in electronic equipment. Before being shipped out as products, the semiconductor devices are subjected to electrical testing to check whether they meet the specification. The testing is performed at wafer level or after dicing the wafer into chips.

In the testing, a probe is brought into contact with a pad of a circuit and a current is taken out from the circuit. Then, whether or not the operation of the circuit satisfies the specification is determined on the basis of the current. In this regard, highly accurate testing is desirable so that the reliability of the testing can be improved.

It should be noted that technologies related to the present invention are disclosed in Japanese Laid-Open Patent Publication Nos. 2000-196021 and 2007-258728.

SUMMARY

According to one aspect discussed herein, there is provided a semiconductor device including an internal circuit that serves to receive or output a signal current, a current mirror unit outputting a copied current corresponding to the signal current, and a test pad from which the copied current is taken out.

According to another aspect discussed herein, there is provided a method of testing a semiconductor device including preparing a semiconductor device including an internal circuit, a current mirror unit, and a test pad, the internal circuit serving to receive or output a signal current, the current mirror unit outputting a copied current corresponding to the signal current, the copied current being taken out from the test pad, and causing a test device to perform electrical testing on the internal circuit by use of the copied current by bringing a probe of the test device into contact with the test pad and taking in the copied current to the test device via the probe.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 14 is a diagram for illustrating opening and closing states of switches in a semiconductor integrated circuit according to the fourth embodiment.

DESCRIPTION OF EMBODIMENT

Before describing embodiments, basic matters for each of the embodiments will be described.

Figure 1:
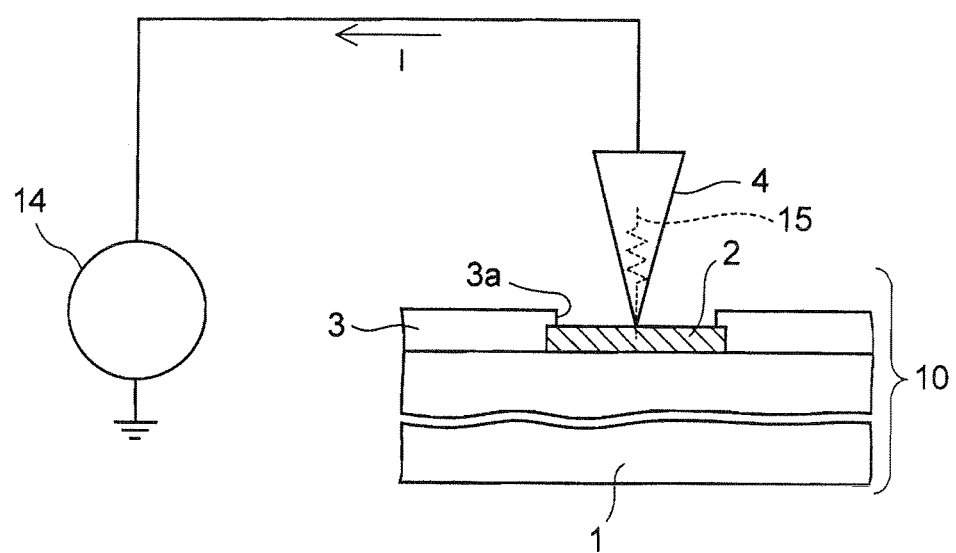
FIG. 1 is a cross sectional view observed when electrical testing is performed on a semiconductor device.

FIG. 1 is a cross sectional view observed when electrical testing is performed on a semiconductor device 10.

As illustrated in FIG. 1, the semiconductor device 10 includes a test pad 2 over a silicon substrate 1. The test pad 2 is exposed through a window 3a of a protection layer 3 such as a polyimide layer, and a probe 4 of a test device 14 comes into contact with the test pad 2 at testing.

In the testing, the test device 14 measures a current I generated in an internal circuit of the semiconductor device 10 while the probe 4 is being in contact with the test pad 2. It is then judged whether the circuit properties of the internal circuit meet the specification or not on the basis of the measurement result.

Meanwhile, when the probe 4 comes into contact with the test pad 2 in this manner, a contact resistance 15 occurs between the probe 4 and the test pad 2. The contact resistance 15, as will be described below, serves as a factor to inhibit the test device 14 from measuring the current I accurately.

Figure 2:
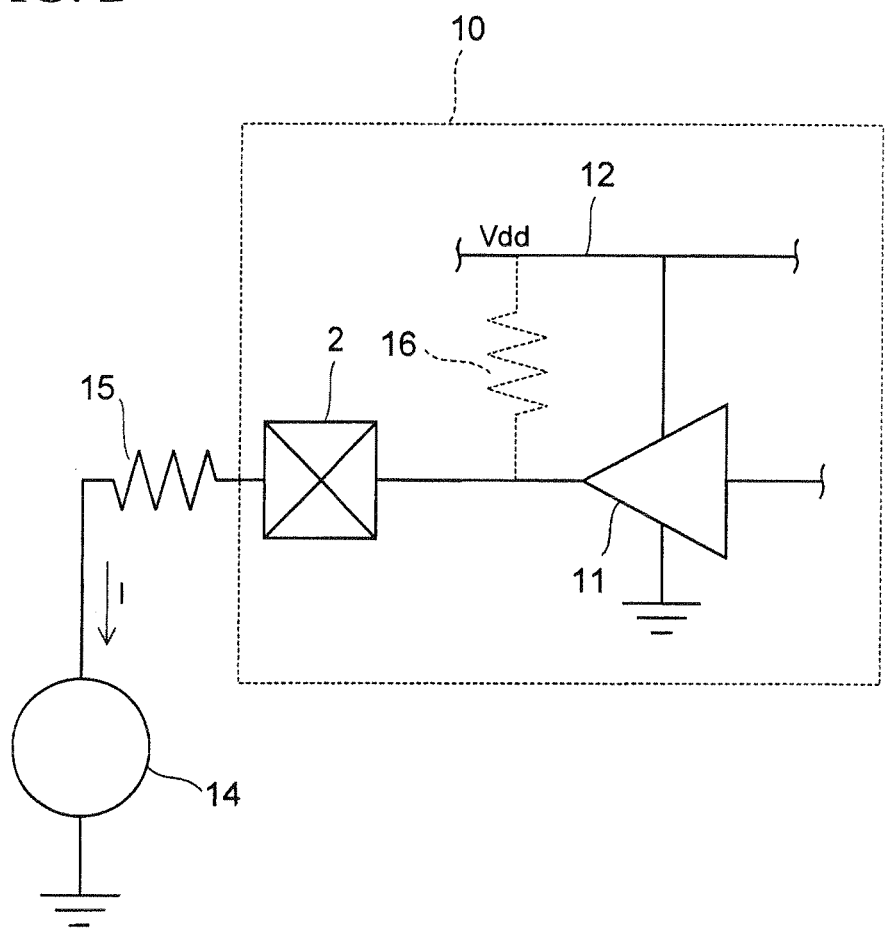
FIG. 2 is an equivalent circuit diagram for the semiconductor device and a test device.

FIG. 2 is an equivalent circuit diagram for the semiconductor device 10 and the test device 14.

As illustrated in FIG. 2, the semiconductor device 10 includes an internal circuit 11.

The internal circuit 11 is used, for example, to match the level of the output voltage of the semiconductor device 10 to the level of the voltage of another semiconductor device, and is driven by a power supply voltage Vdd supplied to a power supply line 12.

In view of resistance, particularly, among the various circuit properties of the internal circuit 11, the internal circuit 11 can be regarded as being equivalent to a resistor 16 connected to the power supply line 12.

The resistor 16 is connected in series to the contact resistance 15 via the test pad 2. When the inner resistance of the test device 14 is disregarded and one of the ends of the contact resistance 15 is regarded as having the ground potential, the current I outputted from the inner circuit 11 is calculated as I=Vdd/(R+r) based on Ohm's law where r is a resistance value of the contact resistance 15 and R is a resistance value of the resistor 16.

However, a current which should be measured by the test device 14 is a current $I_0$ (=Vdd/R) which will be outputted from the inner circuit 11 when the contact resistance 15 is absent. The above-mentioned current I (=Vdd/(R+r)), however, is different from the current $I_0$.

In this manner, attributable to the contact resistance 15, the test device 14 measures the current I different from the current $I_0$ which the test device 14 should measure, thereby making accurate measurement of the circuit properties of the internal circuit 11 difficult.

Accordingly, this method requires cleaning of a tip of the probe 4 (see FIG. 1) in given cycles of maintenance in order to reduce the contact resistance 15, and thus requires longer time for testing. Furthermore, in some cases, the probe 4 needs replacement, which increases the cost for testing.

For this reason, it is difficult with this method to perform testing on the semiconductor device 10 at high speed and low lost.

In view of the above problems, the inventors of the present application have come up with embodiments to be described below.

First Embodiment

Figure 3:
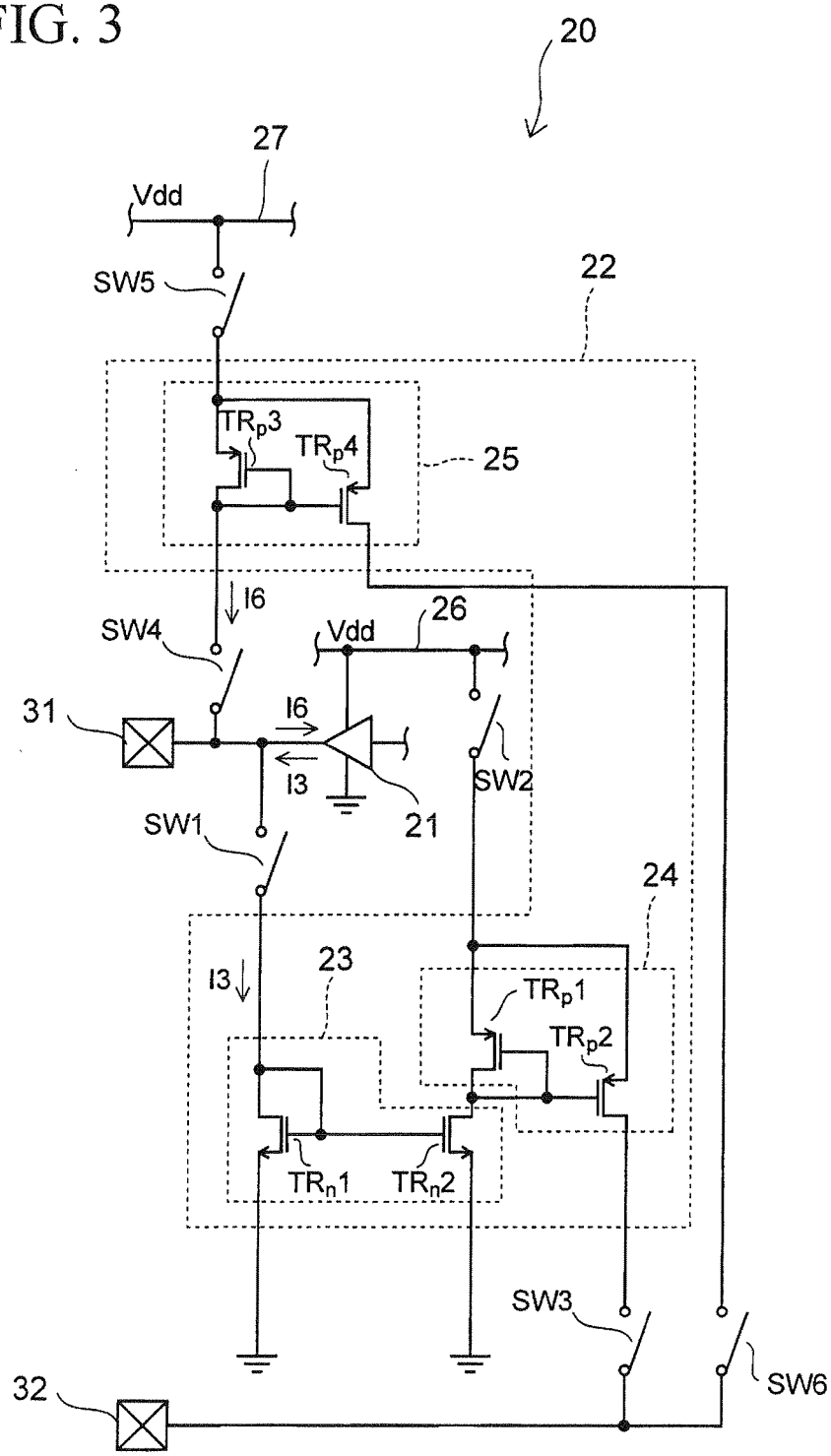
FIG. 3 is a circuit diagram of a semiconductor integrated circuit according to a first embodiment.

FIG. 3 is a circuit diagram of a semiconductor integrated circuit according to this embodiment.

A semiconductor integrated circuit 20 is formed in a semiconductor device such as an LSI, and includes first and second power supply lines 26 and 27, an internal circuit 21, and a current mirror unit 22.

Among these components, the internal circuit 21 is driven by a power supply voltage Vdd supplied to the first power supply line 26 and has a function to match the voltage level of a signal generated in the LSI to the voltage level of another LSI, for example.

The internal circuit 21 is electrically connected to an electrode pad 31. In actual circumstances, the electrode pad 31 is used to electrically connect the internal circuit 21 to another LSI.

The internal circuit 21 outputs an output signal current I3 to another LSI and receives an input signal current I6 from the another LSI.

Meanwhile, the current mirror unit 22 includes first to third current mirror circuits 23 to 25.

Among these circuits, the first current mirror circuit 23 includes a first n-channel MOS transistor $TR_n1$ and a second n-channel MOS transistor $TR_n2$. The output signal current I3 from the internal circuit 21 is inputted into the drain of the first n-channel MOS transistor $TR_n1$. The gate of the second n-channel MOS transistor $TR_n2$ is connected to the gate of the first n-channel MOS transistor $TR_n1$.

In addition, the first n-channel MOS transistor $TR_n1$ has a gate and a drain, which are connected together.

Such a form of connection between the transistors $TR_n1$ and $TR_n2$ is also called as a current mirror connection.

Note that the sources of the transistors $TR_n1$ and $TR_n2$ have the ground potential in this embodiment, because the sources of transistors have to have the same potential in order that a current mirror circuit can exert its function of copying a current.

The second current mirror circuit 24 includes a first p-channel MOS transistor $TR_p1$ and a second p-channel MOS transistor $TR_p2$. The drain current of the transistor $TR_n2$ is inputted into the first p-channel MOS transistor $TR_p1$. The second p-channel MOS transistor $TR_p2$ is connected to the transistor $TR_p1$ in a current mirror configuration.

In this respect, in order that the second current mirror circuit 24 can exert its function of copying a current, the sources of the transistors $TR_p1$ and $TR_p2$ are connected to each other and thus have the same potential.

Meanwhile, the third current mirror circuit 25 includes a third p-channel MOS transistor $TR_p3$ and a fourth p-channel MOS transistor $TR_p4$. An input signal current I6, which is to be inputted into the internal circuit 21, is outputted from the drain of the third p-channel MOS transistor $TR_p3$. The fourth p-channel MOS transistor $TR_p4$ is connected to the transistor $TR_p3$ in a current mirror configuration.

In this respect, in order that the third current mirror circuit 25 can exert its function of copying a current, the sources of the transistors $TR_p3$ and $TR_p4$ are connected to each other and thus have the same potential.

Subsequently, copied current obtained by the copying operation of the current mirror circuits 23 to 25 are taken out through the test pad 32.

Moreover, the semiconductor integrated circuit 20 includes first to sixth switches SW1 to SW6 in separate positions of the semiconductor integrated circuit 20.

Among these switches, each of the first and fourth switches SW1 and SW4 is provided between the current mirror unit 22 and the internal circuit 21. Then, each of the third and sixth switches SW3 and SW6 is provided between the test pad 32 and the current mirror unit 22. Moreover, each of the second and fifth switches SW2 and SW5 is provided between the current mirror unit 22 and a corresponding one of the power supply lines 26 and 27.

Figure 4:
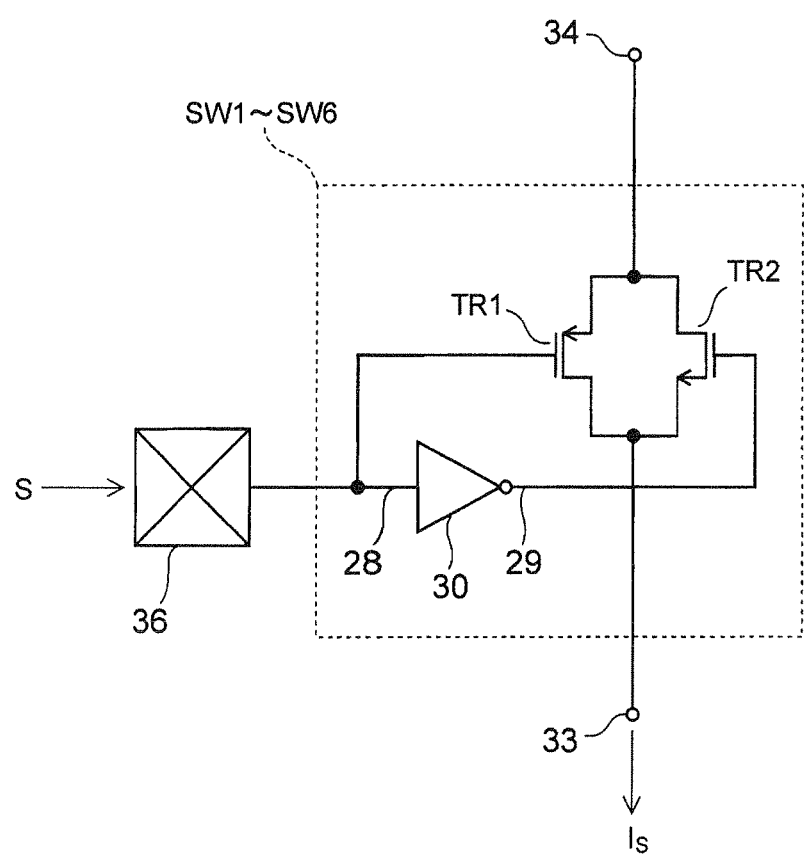
FIG. 4 is a circuit diagram of each switch provided in the semiconductor integrated circuit according to the first embodiment.

FIG. 4 is a circuit diagram of each of these switches SW1 to SW6.

Each of the switches SW1 to SW6 includes a first switching transistor TR1 and a second switching transistor TR2. Among these switching transistors, the first switching transistor TR1 is a p-channel MOS transistor while the second switching transistor TR2 is an n-channel MOS transistor.

The source of the switching transistor TR1 is electrically connected to the drain of the switching transistor TR2, and the drain of the switching transistor TR1 is electrically connected to the source of the switching transistor TR2. The gate of the switching transistor TR1 is electrically connected to an input terminal 28 of an inverter 30, while the gate of the switching transistor TR2 is electrically connected to an output terminal 29 of the inverter 30.

Meanwhile, the input terminal 28 of the inverter 30 is electrically connected to a switching pad 36 with which a probe of an external test device or the like comes into contact.

According to such a circuit configuration, the p-type first switching transistor TR1 is turned on when a switching signal S inputted from the test device to the switching pad 36 is shift to a high level. In this event, the n-type second switching transistor TR2 is also turned on, because a low-level signal obtained from inverting the switching signal S by the inverter 30 is inputted into the gate of the n-type second switching transistor TR2.

Since the transistors TR1 and TR2 are turned on in this state, a current $I_s$ flows between switching terminals 33 and 34. Moreover, the current $I_s$ flows separately through the transistors TR1 and TR2. For this reason, the switches SW1 to SW6 are made less resistive than the case where the switches SW1 to SW6 are constructed from only a single transistor. The use of the switches SW1 to SW6 thus configured is able to prevent the decrease in accuracy in testing the semiconductor integrated circuit 20, the decrease otherwise occurring attributable to the resistances of the switches SW1 to SW6.

Here, only operation needed to turn the switches SW1 to SW6 off is to shift the switching signal S, which is inputted to the switching pad 36, to a low level so as to turn off the transistors TR1 and TR2.

Figure 5:
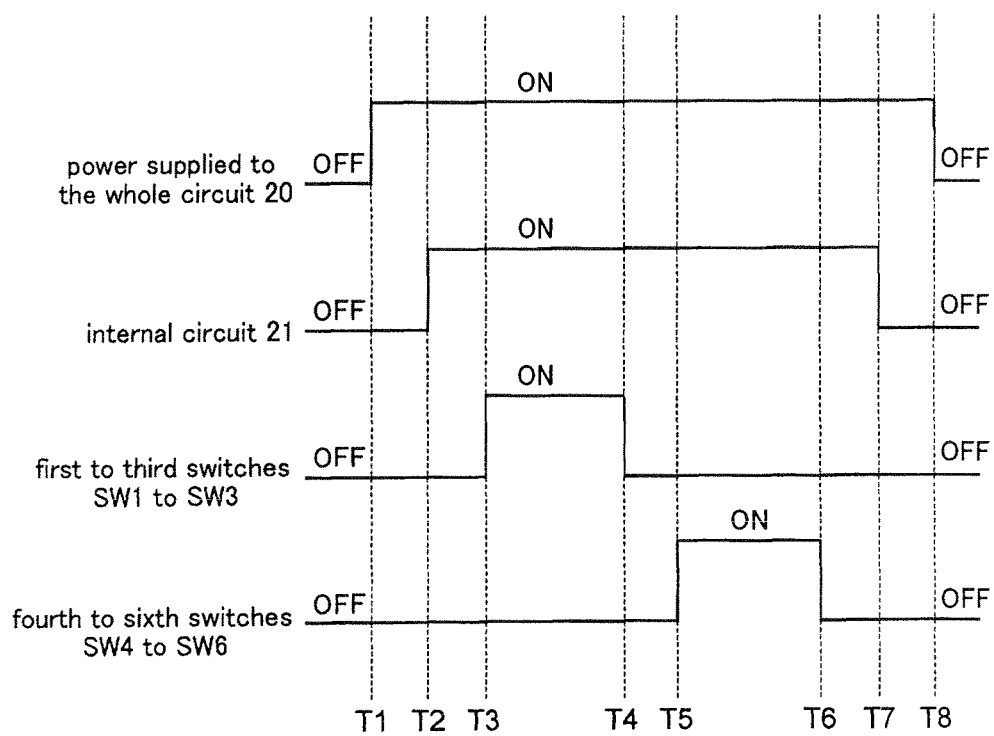
FIG. 5 is a timing chart for testing the semiconductor integrated circuit according to the first embodiment.

Next, referring to FIG. 5 and FIG. 6, a method of testing a semiconductor device in which the semiconductor integrated circuit 20 is formed will be described. FIG. 5 is a timing chart for testing the semiconductor integrated circuit 20. In addition, FIG. 6 is a flowchart of the testing method.

Note that the testing may be performed at wafer level or after dicing the wafer into chips.

Figure 6:
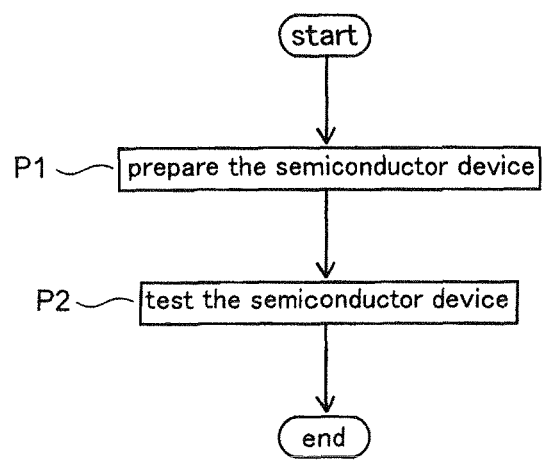
FIG. 6 is a flowchart of a method of testing the semiconductor integrated circuit according to the first embodiment.

Firstly, in Step P1 illustrated in FIG. 6, a semiconductor device, in which the above-mentioned semiconductor integrated circuit 20 is formed, is prepared.

Then the processing proceeds to Step P2, and the testing is performed in the following manner.

At first, as illustrated in FIG. 5, the power supply voltage Vdd is supplied to the power supply lines 26 and 27 (see FIG. 3) at Time T1, so that the whole semiconductor integrated circuit 20 is turned on.

Here, the power supply lines 26 and 27 do not need to receive the power supply voltage Vdd of the same level. Power supply voltages of different levels may be supplied to the power supply lines 26 and 27.

Then, at Time T2, in response to the supply of the power supply voltage Vdd to the first power supply line 26, the internal circuit 21 starts its operation.

Next, at Time T3, the first to third switches SW1 to SW3 are turned on. Here, the fourth to sixth switches SW4 to SW6 are kept to be off.

Figure 7:
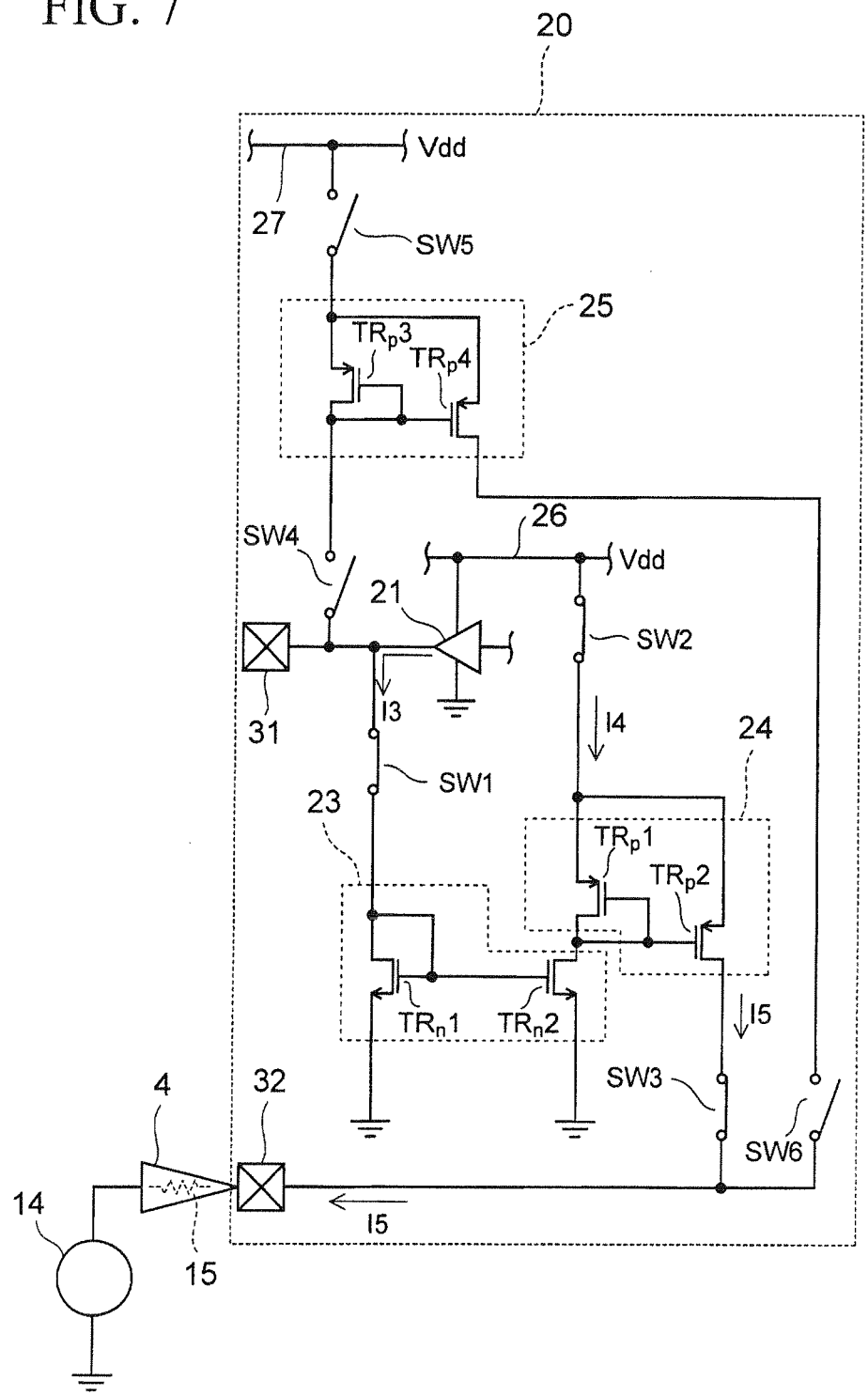
FIG. 7 is a circuit diagram for measuring a second copied current in the semiconductor integrated circuit according to the first embodiment.

FIG. 7 is a circuit diagram of the semiconductor integrated circuit 20 at this time.

As illustrated in FIG. 7, in this state, the output signal current I3 outputted from the internal circuit 21 is inputted into the first current mirror circuit 23 via the first switch SW1.

The first current mirror circuit 23 copies the output signal current I3 thus produce a first copied current I4.

The first copied current I4 is inputted from the first power supply line 26 to the second current mirror circuit 24 via the second switch SW2. Furthermore, the second current mirror circuit 24 copies the first copied current I4 to produce a second copied current I5 which is outputted as the drain current of the second p-channel MOS transistor $TR_p2$.

In the testing, as illustrated in FIG. 7, the probe 4 of the test device 14 is brought into contact with the test pad 32. The probe 4 used here is a probe of a wafer prober or a contactor of an IC tester, for example.

Thus, the test device 14 takes in the second copied current I5 via the third switch SW3 and the test pad 32. By use of the second copied current I5 in place of the signal current I3 outputted from the internal circuit 21, the test device 14 judges whether or not the circuit properties of the internal circuit 21 meet the specification.

Here, the contact resistance 15 occurs between the probe 4 of the test device 14 and the test pad 32. Nevertheless, each of the current mirror circuits 23 and 24 produces the second copied current I5, which always has a constant current value, irrespective of whether the contact resistance 15 is present or not.

Accordingly, it is possible in this embodiment to perform testing on the internal circuit 21 to obtain its circuit properties on the basis of the second copied current I5, which is made constant in current value, by eliminating the effect of the contact resistance 15.

Two stages of the current mirror circuits 23 and 24 are used in this embodiment. Alternatively, it is also conceivable to use only the first current mirror circuit 23 and to take out the first copied current I4, which is outputted from the circuit 23, through the test pad 32.

However, as has been described, the first current mirror circuit 23 exerts its function of copying a current when the sources of the two transistors $TR_n1$ and $TR_n2$ have the same potential. For this reason, if the source of the transistor $TR_n2$ is connected to the test pad 32, the sources of the transistors $TR_n1$ and $TR_n2$ may have different potentials depending on the potential of the probe 4. In this case, there is a possibility that the first current mirror circuit 23 does not exert its function of copying a current.

For this reason, as in this embodiment, when the output current I3 is to be copied, it is preferable to provide the second current mirror circuit 24 including the p-channel transistors $TR_p1$ and $TR_p2$ in the subsequent stage of the first current mirror circuit 23, and to take out the second copied current I5 from the drain of the transistor $TR_p2$.

Next, at Time T4 of FIG. 5, the first to third switches SW1 to SW3 are turned off.

Subsequently, at Time T5, the fourth to sixth switches SW4 to SW6 are turned on.

Figure 8:
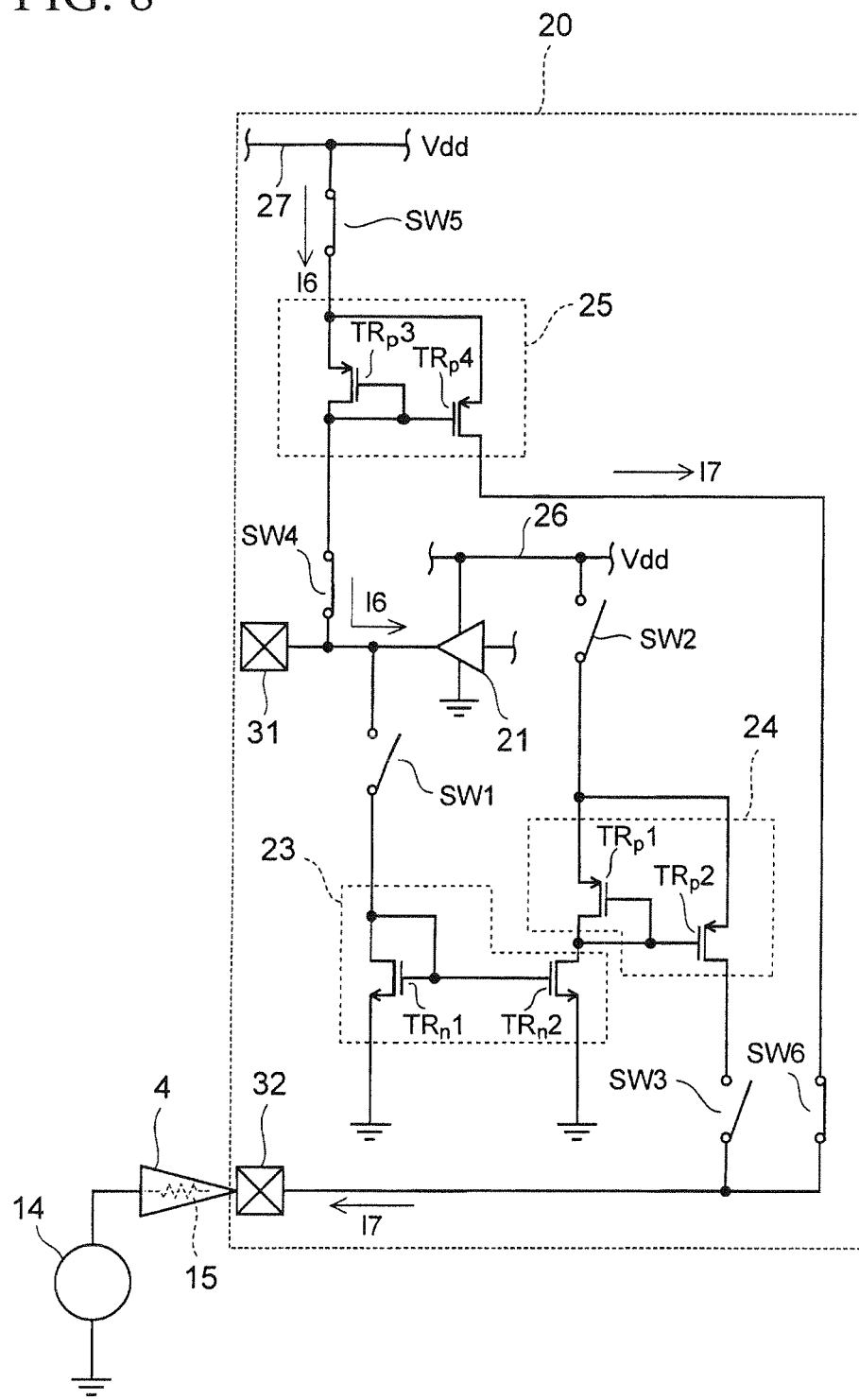
FIG. 8 is a circuit diagram for measuring a third copied current in the semiconductor integrated circuit according to the first embodiment.

FIG. 8 is a circuit diagram of the semiconductor integrated circuit 20 at this time.

As illustrated in FIG. 8, in this state, the input signal current I6 is inputted into the third current mirror circuit 25 from the second power supply line 27 via the fifth switch SW5.

The input signal current I6 is outputted from the drain of the third p-channel MOS transistor $TR_p3$ via the fourth switch SW4 and finally inputted to the internal circuit 21.

Moreover, the third current mirror circuit 25 copies the input signal current I6 to produce a third copied current I7 which is outputted as the drain current of the fourth p-channel MOS transistor $TR_p4$.

The third copied current I7 is inputted to the test device 14 via the sixth switch SW6 and the test pad 32. By use of the third copied current I7 in place of the signal current I6 inputted to the internal circuit 21, the test device 14 judges whether or not the circuit properties of the internal circuit 21 meet the specification.

In this event, even if the contact resistance 15 is present between the probe 4 of the test device 14 and the test pad 32, the third current mirror circuit 25 produces the third copied current I7 which always has a constant current value irrespective whether the contact resistance 15 is present or not.

For this reason, by using the third copied current I7 which is obtained by, in the above-described manner, copying the input signal current I6 and is thus made constant in current value, it is possible to eliminate the effect of the contact resistance 15, also in the case of judging whether or not the input signal current I6 inputted to the internal circuit 21 satisfies the specification.

Thereafter, at Time T6 of FIG. 5, the fourth to sixth switches SW4 to SW6 are turned off. Then, at Time T7, the internal circuit 21 finishes its operation.

Finally, at Time T8, the supply of the power supply voltage Vdd to the power supply lines 26 and 27 is stopped to finish the testing on the semiconductor integrated circuit 20.

In the example illustrated in FIG. 5, the testing is performed by using the second copied current I5 between Time T3 to Time T4, and then the testing is performed by using the third copied current I7 between Time T5 to Time T6. However, the testing order is not limited to this.

For example, the testing may be performed by using the third copied current I7 first, and then by using the second copied current I5. Alternatively, the testing may be performed only by using either one of the second copied current I5 and the third copied current I7.

As has been described above, according to the present embodiment, the test device 14 does not directly measures the signal currents I3 and I6 outputted from and inputted to the internal circuit 21, but measures the second and the third copied current I5 and I7 which are obtained from copying the respective signal currents I3 and I6 by the current mirror unit 22.

Each of the copied current I5 and I7 produced by the current mirror unit 22 has a value which does not fluctuate due to the contact resistance 15. For this reason, in this embodiment, it is possible to accurately test the internal circuit 21 on the basis of the copied current I5 and I7, while eliminating the effect of the contact resistance 15.

Moreover, the elimination of the effect of the contact resistance 15 enables reduction in the frequencies of cleaning or replacement of the probe 4 for the purpose of reducing the contact resistance 15. This can make the test device 14 substantially maintenance free. Thus, the testing can be performed at high speed and low cost.

Second Embodiment

In this embodiment, description will be given of preferable sizes for the transistors $TR_n1$, $TR_n2$, and $TR_p1$ to $TR_p4$ included in the first to third current mirror circuits 23 to 25 described in the first embodiment.

Figure 9:
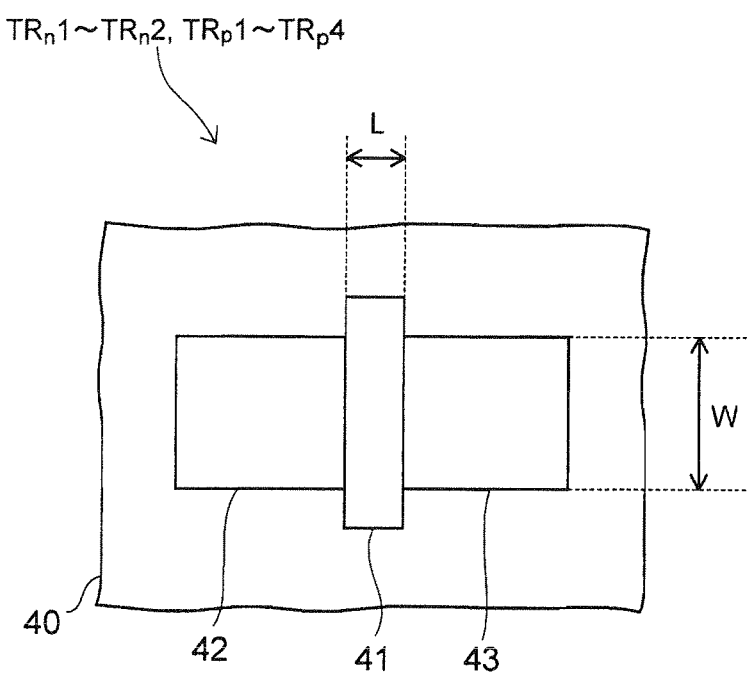
FIG. 9 is a plan view for illustrating the size of a transistor in a semiconductor integrated circuit according to a second embodiment.

FIG. 9 is a plan view for illustrating the size of each transistor.

As illustrated in FIG. 9, each of the transistors $TR_n1$, $TR_n2$, and $TR_p1$ to $TR_p4$ includes a gate electrode 41, a source 42, and a drain 43 on a semiconductor substrate 40 such as a silicon substrate.

Here, a size α of each transistor is defined by a ratio W/L, where W is a gate width of the transistor and L is a gate length of the transistor. An amplification factor β of the transistor is proportional to the size α (=W/L).

Figure 10:
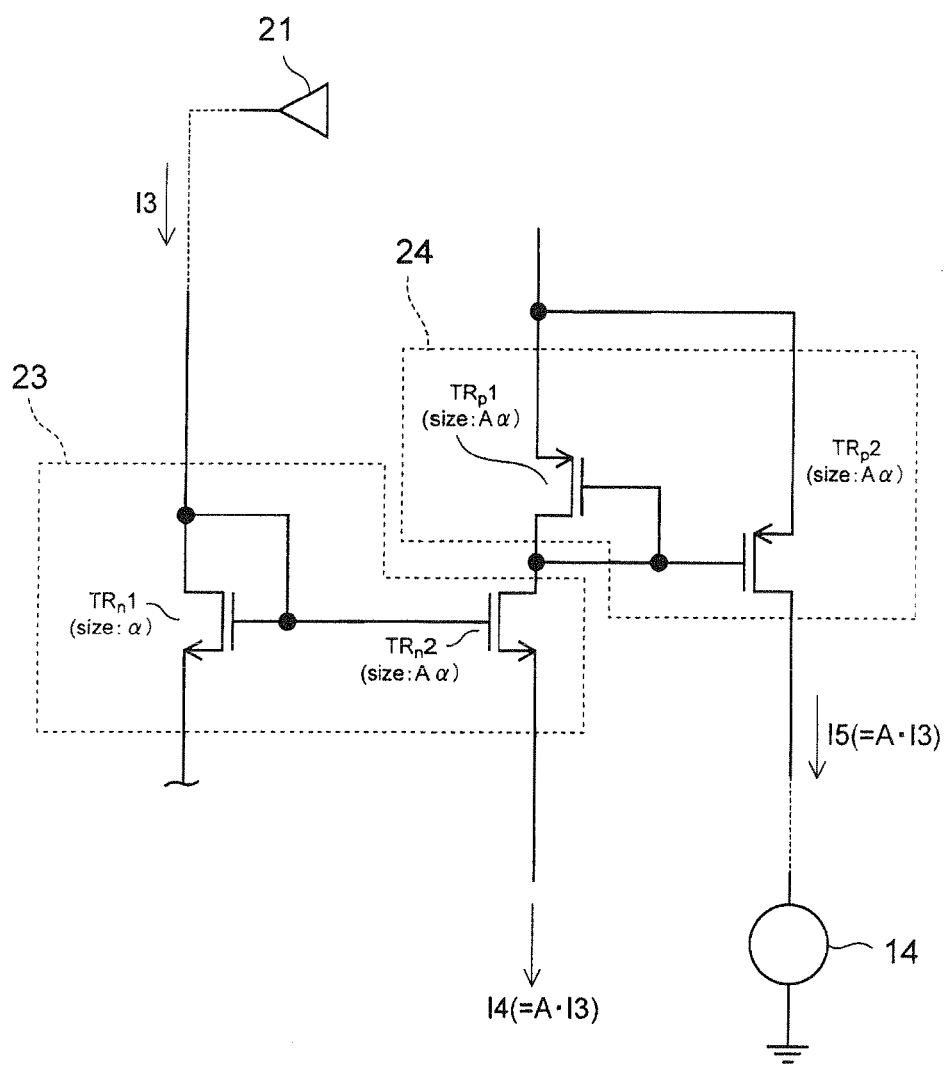
FIG. 10 is a circuit diagram for illustrating the sizes of transistors in a first current mirror circuit and a second current mirror circuit in the semiconductor integrated circuit according to the second embodiment.

FIG. 10 is a circuit diagram for illustrating the sizes of the transistors $TR_n1$, $TR_n2$, $TR_p1$, and $TR_p2$ in the first current mirror circuit 23 and the second current mirror circuit 24.

As illustrated in FIG. 10, in this embodiment, when the size of the first n-channel MOS transistor $TR_n1$ is α, the sizes of the other transistors $TR_n2$, $TR_p1$, and $TR_p2$ are A times as large as the size α. To obtain such a size, it suffices to set the gate width W of each of the transistors $TR_n2$, $TR_p1$, and $TR_p2$ to be A times as large as the gate width W of the transistor $TR_n1$.

Here, the magnitude of the first copied current I4 produced by the first current mirror circuit 23 depends on the ratio of the size of the transistor $TR_n1$ to the size of the transistor $TR_n2$. For example, as in the above case where the size of the transistor $TR_n2$ is A times as large as the size of the transistor $TR_n1$, the magnitude of the first copied current I4 is A times as large as the magnitude of the signal current I3.

Meanwhile, since the transistors $TR_p1$ and $TR_p2$ in the second current mirror circuit 24 have the same size, the magnitude of the second copied current I5 to be produced is the same as the magnitude of the first copied current I4.

Accordingly, the magnitude of the second copied current I5 consequently is A times as large as the magnitude of the original signal current I3.

The ratio A between the sizes of the transistors $TR_n1$, $TR_n2$, $TR_p1$, and $TR_p2$ is determined in accordance with the original signal current I3 in the following manner.

For example, the signal current I3 is weak in some cases. In this case, if the copied current I5 of the same magnitude as that of the signal current I3 is produced, the test device 14 cannot measure the copied current I5 securely.

Accordingly, it is preferable in this case to set the size ratio A to a value larger than 1, e.g., 10, so that the magnitude of the second copied current I5 is increased to 10 times as large as that of the original signal current I3. With this setting, the test device 14 can measure the copied current I5 securely as compared to when it measures the second copied current I5 which is obtained by copying the original signal current I3 and which has the same magnitude as the signal current I3.

Meanwhile, in the case where a high power is required for the internal circuit 21, the internal circuit 21 outputs the signal current I3 having a large current value. If such signal current I3 is copied into the first copied current I5 having the same magnitude as the signal current I3, the test device 14 generates heat in some cases.

Accordingly, it is preferable in this case to set the size ratio A to a value smaller than 1, e.g., 1/10 so that the second copied current I5 has the magnitude decreased to 1/10 times as large as that of the original signal current I3. With this setting, the test device 14 can be prevented from generating heat which otherwise the test device 14 would generate if the original signal current I3 is copied into the second copied current I5 having the same magnitude as the signal current I3.

Figure 11:
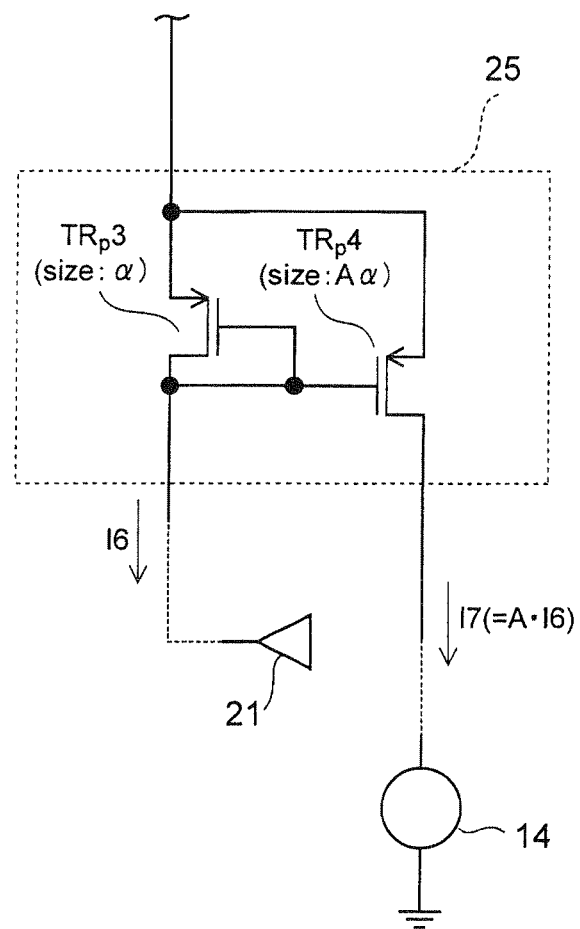
FIG. 11 is a circuit diagram for illustrating the sizes of transistors in a third current mirror circuit in the semiconductor integrated circuit according to the second embodiment.

FIG. 11 is a circuit diagram for illustrating the sizes of the transistors $TR_p3$ and $TR_p4$ in the third current mirror circuit 25.

As illustrated in FIG. 11, in the third current mirror circuit 25 as well, when the size of the third p-channel MOS transistor $TR_p3$ is α, the size of the fourth p-channel MOS transistor $TR_p4$ is set to A times as large as the size α.

The value of the size ratio A is determined in accordance with the magnitude of the input signal current I6 inputted to the internal circuit 21, for the same reason as described by using FIG. 10. Namely, in the case where the signal current I6 is weak, the size ratio A is preferably set as a value larger than 1 so that the third copied current I7 has a large magnitude. In the case where the signal current I6 is strong, the size ratio A is preferably set as a value smaller than 1 so that the third copied current I7 has a small magnitude.

As described in the above, according to the present embodiment, each of the copied current I5 and 17 can be produced to have a magnitude according to the size ratio A between the transistors. For this reason, the copied current I5 and 17 can be adjusted to suitable magnitudes for measurement by the test device 14.

Third Embodiment

Figure 12:
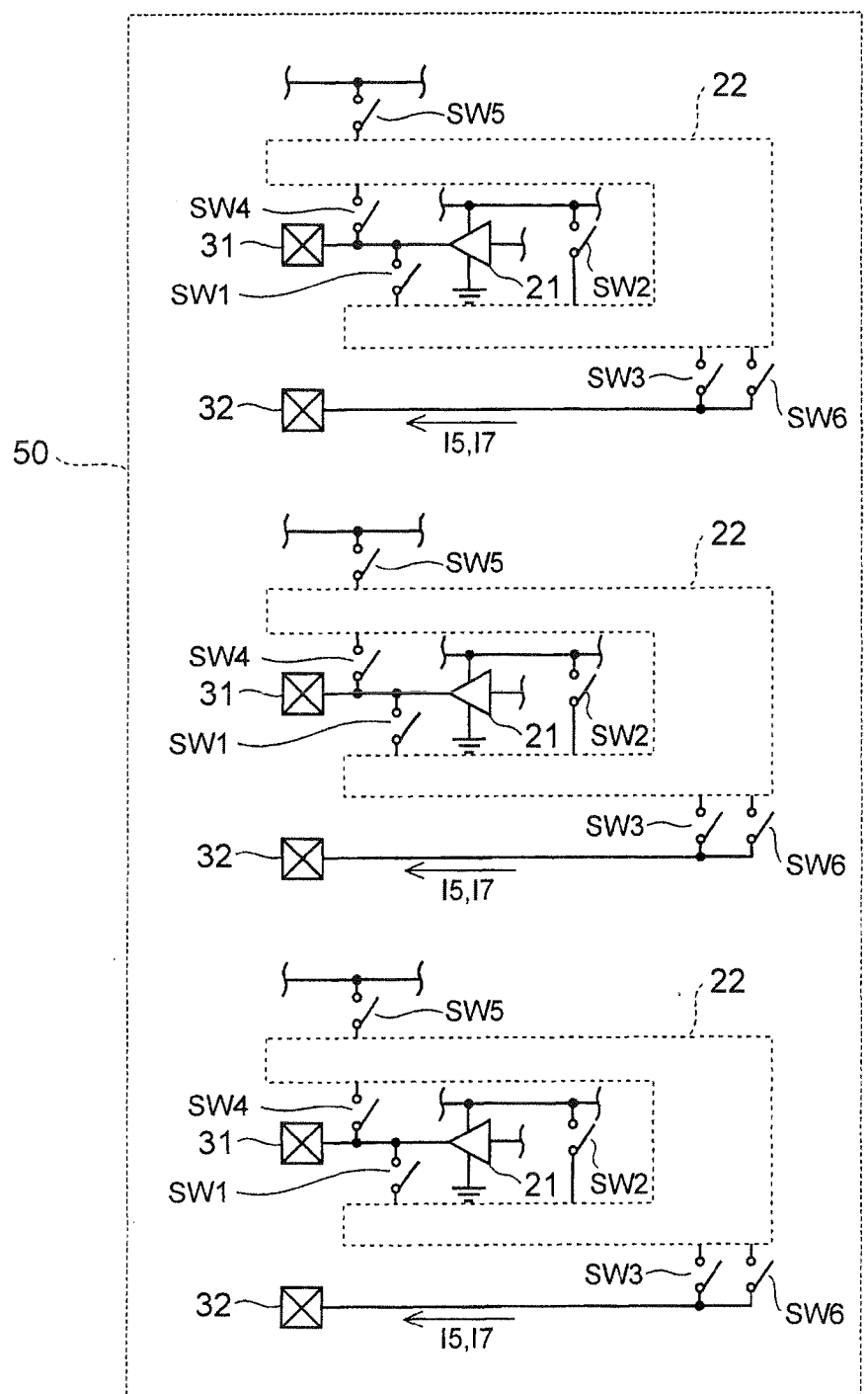
FIG. 12 is a circuit diagram of a semiconductor integrated circuit according to a third embodiment.

FIG. 12 is a circuit diagram of a semiconductor integrated circuit according to this embodiment.

Note that, components in FIG. 12 which are the same as those described in the first embodiment will be denoted by the same reference numerals, and their explanation will be omitted below.

As illustrated in FIG. 12, a semiconductor integrated circuit 50 according to this embodiment includes multiple internal circuits 21 and multiple current mirror units 22 for the respective internal circuits 21. The form of connection between each internal circuit 21 and its corresponding current mirror unit 22 is the same as the one described in the first embodiment and thus its explanation will be omitted here.

In this configuration, the second copied current I5 and the third copied current I7 can be produced from each of the multiple internal circuits 21. Therefore, the internal circuits 21 can be each tested individually by use of the corresponding copped current I5 and I7.

Fourth Embodiment

Figure 13:
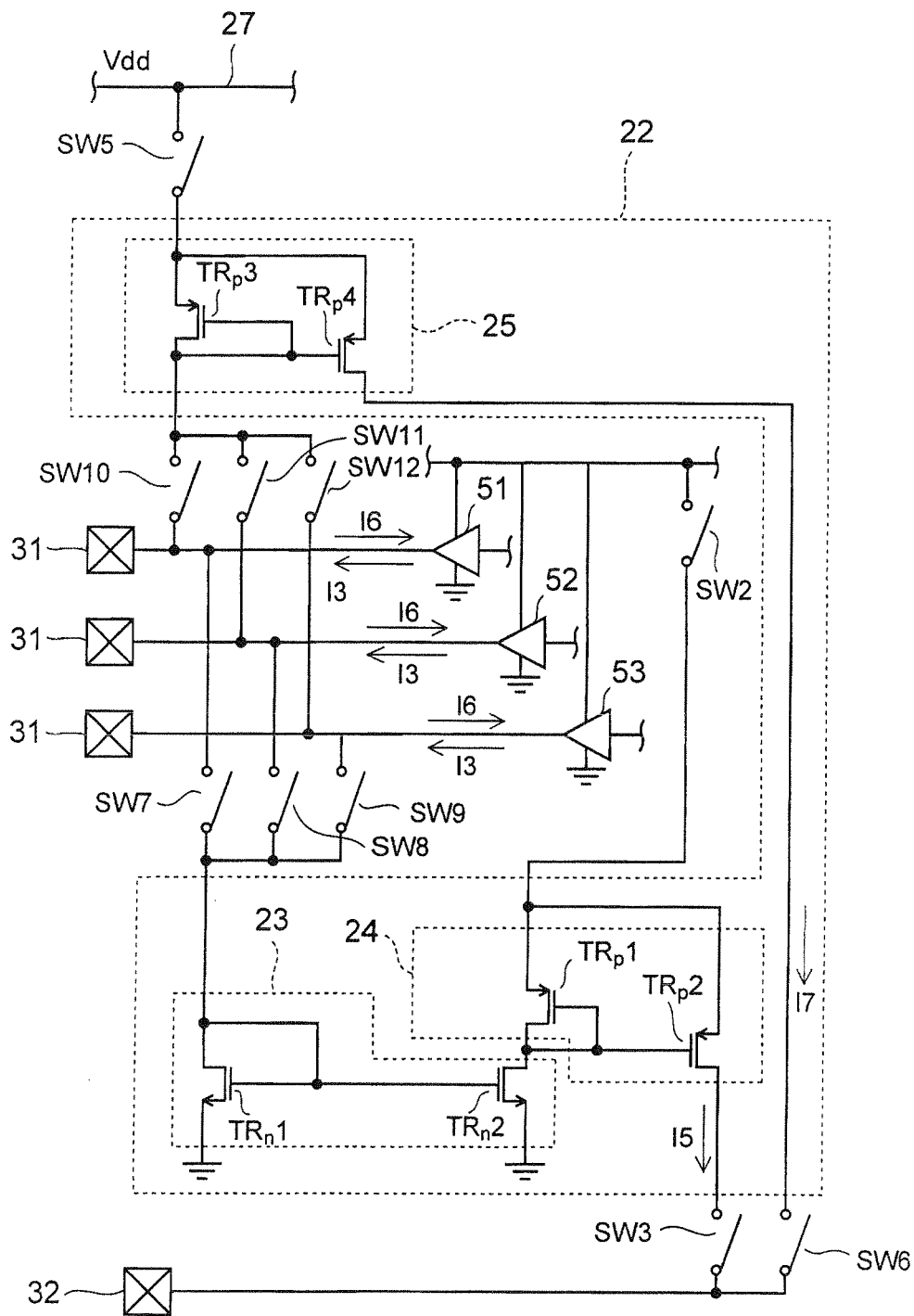
FIG. 13 is a circuit diagram of a semiconductor integrated circuit according to a fourth embodiment.

FIG. 13 is a circuit diagram of a semiconductor integrated circuit according to this embodiment.

Note that, components in FIG. 13 which are the same as those described in the first embodiment will be denoted by the same reference numerals, and their explanation will be omitted below.

As illustrated in FIG. 13, in this embodiment, first to third internal circuits 51 to 53 are provided. Each of internal circuits 51 to 53 serve to output and receive the above-described signal currents I3 and I6. Moreover, seventh to 12th switches SW7 to SW12 are provided so that only one of the internal circuits 51 to 53 can be connected to the current mirror unit 22 selectively.

Here, the circuit configuration and the operation of the current mirror unit 22 are the same as those in the first embodiment.

According to this circuit configuration, the multiple internal circuits 51 to 53 can each copy the signal currents I3 and I6 by use of the single common current mirror unit 22.

For example, in order to copy the output signal current I3 outputted from the first internal circuit 51 to obtain the second copied current I5, the switches SW2, SW3, and SW7 are turned on, and the other switches SW5, SW6, and SW8 to SW12 are turned off.

For example, when copying the input signal current I6 inputted to the first internal circuit 51 to obtain the third copied current I7, the switches SW5, SW6, and SW10 are turned on, and the other switches SW2, SW3, SW7 to SW9, SW11, and SW12 are turned off.

The testing can be performed on the first internal circuit 51 in the same manner as in the first embodiment, by measuring the copied current I5 and I7 by the test device via the test pad 32.

Likewise, when testing is to be performed on the second internal circuit 52 or the third internal circuit 53, it suffices to copy the signal currents I3 and I6 by controlling ON and OFF states of each of the switches SW3, and SW6 to SW12 in a manner as illustrated in FIG. 14.

According to the above embodiment, the single common current mirror unit 22 is shared by the internal circuits 51 to 53 as illustrated in FIG. 13. For this reason, it is possible to make a semiconductor integrated circuit smaller than the one which has the multiple current mirror units 22 respectively provided for the internal circuits 51 to 53.

Fifth Embodiment

In the first embodiment, as illustrated in FIG. 4, the switching pad 36 is provided specially for the purpose of switching the switches SW1 to SW6, and ON and OFF states of the switches SW1 to SW6 are controlled with the input of the switching signal S to the switching pad 36.

In this embodiment, instead of providing such the special pad 36 used for switching purpose only, the switches SW1 to SW6 are controlled by a pad prepared for multi-purpose use as will be described below.

Figure 15:
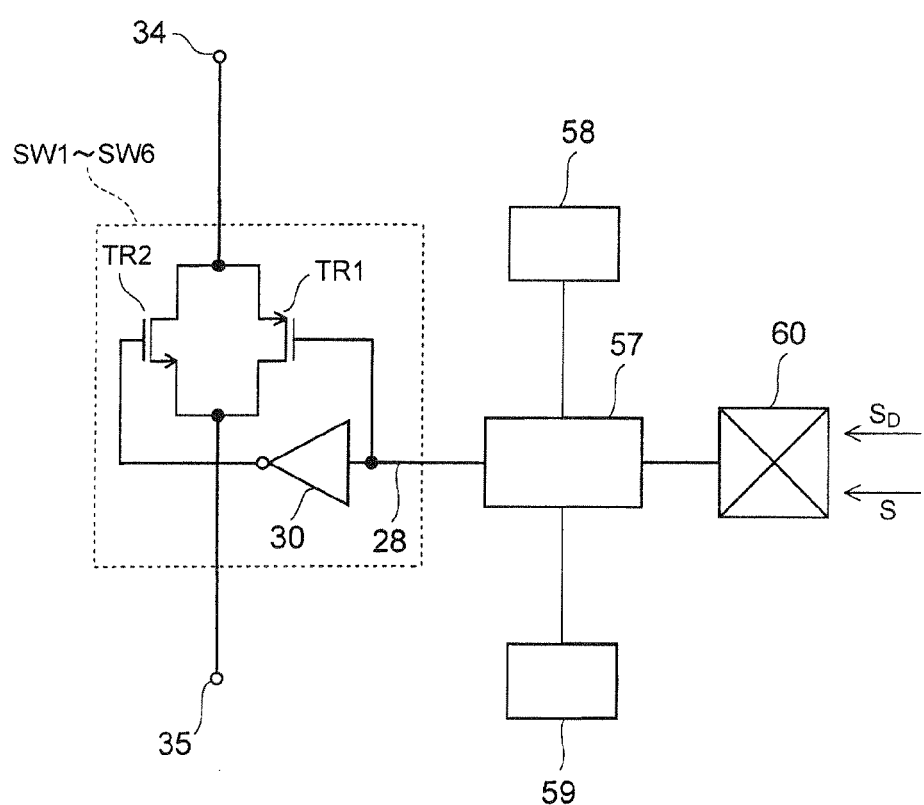
FIG. 15 is a circuit diagram of a switch according to a fifth embodiment.

FIG. 15 is a circuit diagram of each of the switches SW1 to SW6 according to this embodiment and its peripheral components. Note that, components in FIG. 15 which are the same as those described in the first embodiment will be denoted by the same reference numerals, and their explanation will be omitted below.

As illustrated in FIG. 15, the circuit configuration of each of the switches SW1 to SW6 is the same as that of the first embodiment illustrated in FIG. 4.

However, in this embodiment, a logic circuit 57 is electrically connected to the input terminal 28 of the inverter 30 in each of the switches SW1 to SW6. The logic circuit 57 is electrically connected to an electrode pad 60 for multi-purpose use and internal circuits 58 and 59 which are different from the internal circuit to be subjected to testing.

The logic in the logic circuit 57 can be changed by serial data $S_D$ inputted from the electrode pad 60. In response to the change in the logic, the logic circuit 57 electrically connects the electrode pad 60 to any one of the internal circuits 58 and 59 and the switches SW1 to SW6.

With this configuration, the electrode pad 60 can be used as an input and/or output pad for taking out a signal from the different internal circuits 58 and 59, or can be used as a pad for inputting a switching signal S to either one of the switches SW1 to SW6. Accordingly, the number of pads can be made less than that in the case where the special switching pad 36 to which the switching signal S is inputted is provided as in the first embodiment.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:
1. A semiconductor device, comprising:
an internal circuit that serves to receive or output a signal current;
a current mirror unit outputting a copied current corresponding to the signal current; and
a test pad from which the copied current is taken out,
wherein the current mirror unit comprises:
a first current mirror circuit including a first first-conductivity type MOS transistor and a second first-conductivity type MOS transistor, a drain of the first first-conductivity type MOS transistor receiving the signal current outputted from the internal circuit, the second first-conductivity type MOS transistor being connected to the first first-conductivity type MOS transistor in a current mirror configuration; and
a second current mirror circuit including a first second-conductivity type MOS transistor and a second second-conductivity type MOS transistor, the first second-conductivity type MOS transistor receiving a drain current of the second first-conductivity type MOS transistor, the second second-conductivity type MOS transistor being connected to the first second-conductivity type MOS transistor in a current mirror configuration, and wherein a drain current of the second second-conductivity type MOS transistor is taken out from the test pad as the copied current, and wherein the first conductivity type is an n type and the second conductivity type is a p type.

2. The semiconductor device according to claim 1, wherein a size of the first first-conductivity type MOS transistor is smaller than a size of the second first-conductivity type MOS transistor.

3. The semiconductor device according to claim 1, wherein a size of the first first-conductivity type MOS transistor is larger than a size of the second first-conductivity type MOS transistor.

4. The semiconductor device according to claim 2, wherein
the size of the first first-conductivity type MOS transistor is defined by a ratio of a gate width of the first first-conductivity type MOS transistor to a gate length thereof, and the size of the second first-conductivity type MOS transistor is defined by a ratio of a gate width of the second first-conductivity type MOS transistor to a gate length thereof.

5. The semiconductor device according to claim 1, wherein
the current mirror unit includes a third current mirror circuit including a third second-conductivity type MOS transistor and a fourth second-conductivity type MOS transistor, a drain of the third second-conductivity type MOS transistor outputting the signal current inputted to the internal circuit, the fourth second-conductivity type MOS transistor being connected to the third second-conductivity type MOS transistor in a current mirror configuration, and a drain current of the fourth second-conductivity type MOS transistor is taken out from the test pad as the copied current.

6. The semiconductor device according to claim 1, further comprising:
a plurality of the internal circuits; and
a plurality of the current mirror units being respectively provided for the plurality of the internal circuits.

7. The semiconductor device according to claim 1, further comprising:
a plurality of the internal circuits; and
a switch for selectively connecting any one of the plurality of the internal circuits to the current mirror unit is provided.

8. The semiconductor device according to claim 1, wherein a switch opening and closing in response to a switching signal is provided at any of a position between the test pad and the current mirror unit, a position between the current mirror unit and the internal circuit, and a position between a power supply line and the current mirror unit.

9. The semiconductor device according to claim 8, wherein the switch includes:
a first switching transistor;
a second switching transistor having a conductivity type different from a conductivity type of the first switching transistor, a source of the second switching transistor being electrically connected to a drain of the first switching transistor, a drain of the second switching transistor being electrically connected to a source of the first switching transistor; and
an inverter having an input terminal and an output terminal, the input terminal being electrically connected to a gate of the first switching transistor, the output terminal being electrically connected to a gate of the second switching transistor, and opening and closing of each of the first switching transistor and the second switching transistor are controlled by inputting the switching signal to the inverter.

10. The semiconductor device according to claim 8, further comprising:
an electrode pad;
an internal circuit different from the internal circuit; and
a logic circuit, wherein
by changing a logic of the logic circuit, the logic circuit electrically connects the electrode pad selectively to any one of the switch and the different internal circuit.

11. A method of testing a semiconductor device, comprising:
preparing a semiconductor device including an internal circuit, a current mirror unit, and a test pad, the internal circuit serving to receive or output a signal current, the current mirror unit outputting a copied current corresponding to the signal current, the copied current being taken out from the test pad; and causing a test device to perform electrical testing on the internal circuit by use of the copied current by bringing a probe of the test device into contact with the test pad and taking in the copied current to the test device via the probe, wherein the current mirror unit comprises:
a first current mirror circuit including a first first-conductivity type MOS transistor and a second first-conductivity type MOS transistor, a drain of the first first-conductivity type MOS transistor receiving the signal current outputted from the internal circuit, the second first-conductivity type MOS transistor being connected to the first first-conductivity type MOS transistor in a current mirror configuration; and a second current mirror circuit including a first second-conductivity type MOS transistor and a second second-conductivity type MOS transistor, the first second-conductivity type MOS transistor receiving a drain current of the second first-conductivity type MOS transistor, the second second-conductivity type MOS transistor being connected to the first second-conductivity type MOS transistor in a current mirror configuration, and wherein a drain current of the second second-conductivity type MOS transistor is taken from the test pad as the copied current, and wherein the first conductivity type is an n type and the second conductivity type is a p type.

12. The method of testing a semiconductor device according to claim 11, wherein
the current mirror unit includes a third current mirror circuit including a third second-conductivity type MOS transistor and a fourth second-conductivity type MOS transistor, a drain of the third second-conductivity type MOS transistor outputting the signal current inputted to the internal circuit, the fourth second-conductivity type MOS transistor being connected to the third second-conductivity type MOS transistor in a current mirror configuration, and a drain current of the fourth second-conductivity type MOS transistor is taken out from the test pad as the copied current.

13. The semiconductor device according to claim 3, wherein the size of the first first-conductivity type MOS transistor is defined by a ratio of a gate width of the first first-conductivity type MOS transistor to a gate length thereof, and the size of the second first-conductivity type MOS transistor is defined by a ratio of a gate width of the second first-conductivity type MOS transistor to a gate length thereof.

\* \* \* \* \*